United States Patent
Fromson et al.

(10) Patent No.: US 6,884,561 B2
(45) Date of Patent: Apr. 26, 2005

(54) ACTINICALLY IMAGEABLE AND INFRARED HEATED PRINTING PLATE

(75) Inventors: Howard A. Fromson, Stonington, CT (US); William J. Rozell, Vernon, CT (US)

(73) Assignee: Anocoil Corporation, Rockville, CT (US)

( * ) Notice: Subject to any disclaimer, the term of this patent is extended or adjusted under 35 U.S.C. 154(b) by 0 days.

(21) Appl. No.: 10/244,247

(22) Filed: Sep. 16, 2002

(65) Prior Publication Data

US 2003/0054282 A1 Mar. 20, 2003

Related U.S. Application Data

(63) Continuation of application No. 09/746,954, filed on Dec. 22, 2000, now abandoned, which is a continuation of application No. 09/653,726, filed on Sep. 1, 2000, now Pat. No. 6,355,398, which is a continuation-in-part of application No. 09/482,483, filed on Jan. 12, 2000, now abandoned.

(51) Int. Cl.⁷ .............................................. G03F 7/021
(52) U.S. Cl. .................... 430/157; 430/175; 430/287.1; 430/288.1; 430/302
(58) Field of Search ................................. 430/157, 175, 430/287.1, 288.1, 302

(56) References Cited

U.S. PATENT DOCUMENTS

| | | | |
|---|---|---|---|
| 4,356,254 A | 10/1982 | Takahashi et al. | 430/296 |
| 4,383,261 A | 5/1983 | Goldberg | 346/1.1 |
| 4,530,080 A | 7/1985 | Aoi et al. | 369/45 |
| 4,731,317 A * | 3/1988 | Fromson et al. | 430/159 |
| 4,783,390 A * | 11/1988 | Mino et al. | 430/156 |
| 5,057,394 A * | 10/1991 | Yabe et al. | 430/145 |
| 5,200,292 A | 4/1993 | Shinozaki et al. | 430/178 |
| 5,264,318 A * | 11/1993 | Yabe et al. | 430/175 |
| 5,397,675 A * | 3/1995 | Arimatsu et al. | 430/175 |
| 5,695,905 A * | 12/1997 | Savariar-Hauck et al. | 430/162 |
| 5,741,619 A * | 4/1998 | Aoshima et al. | 430/175 |
| 5,840,467 A | 11/1998 | Kitatani et al. | 430/302 |
| 5,858,626 A | 1/1999 | Sheriff et al. | 430/326 |
| 5,934,196 A | 8/1999 | Korem | 101/467 |
| 6,060,217 A | 5/2000 | Nguyen et al. | 430/302 |
| 6,100,004 A | 8/2000 | Elsaesser et al. | 430/176 |
| 6,458,511 B1 * | 10/2002 | Wittig et al. | 430/302 |

* cited by examiner

*Primary Examiner*—John S. Chu
(74) *Attorney, Agent, or Firm*—Alix, Yale & Ristas, LLP

(57) ABSTRACT

A negative-working lithographic printing plate has a coating which is imaged by heating an area of the coating with an infrared laser and actinically reacting the coating in the heated area with ultraviolet or visible radiation. The coating contains an infrared absorber but the coating is not imageable by infrared radiation or by the heat generated. The imaging time is reduced since the actinic reaction rate is increased at the elevated temperature.

5 Claims, No Drawings

ACTINICALLY IMAGEABLE AND INFRARED HEATED PRINTING PLATE

This application is a continuation of U.S. patent application Ser. No. 09/746,954 filed Dec. 22, 2000, now abandoned, which is a continuation of U.S. patent application Ser. No. 09/653,726 filed Sep. 1, 2000, now U.S. Pat. No. 6,355,398, which is a continuation-in-part of U.S. patent application Ser. No. 09/482,483 filed Jan. 12, 2000, now abandoned.

BACKGROUND OF THE INVENTION

The present invention relates to a lithographic printing plate or other imageable plates having a coating actinically imageable by ultraviolet or visible radiation.

One type of imageable lithographic printing plate or other imageable plate is a negative-working, actinic plate which has a resin coating normally soluble in a developer and which is rendered insoluble when exposed to radiation in the ultraviolet or visible wavelength range. The plate is imaged by exposing the coating to the radiation in those areas corresponding to the image to be printed with those areas crosslinking and becoming insoluble and ink receptive.

Actinic imaging, whether it be by ultraviolet radiation or by visible radiation, can be accomplished by one of two techniques. One technique is to expose the printing plate through a film negative. The other approach is to serially scan the plate with small image spots or areas. This latter approach can be accomplished by digital laser imaging or by a method referred to as digital screen imaging which will be explained later. Although digital screen imaging is not digital imaging in the strictest sense of that term as will be explained, the term "digital" will be used herein to encompass both the digital laser imaging and the digital screen imaging which both involve imaging by serially scanning the plate with small areas or spots of the imaging radiation. In any of these imaging operations, the rate of imaging is a significant factor.

SUMMARY OF THE INVENTION

An object of the present invention is to provide a negative-working lithographic printing plate with a coating which is actinically imageable by either ultraviolet or visible radiation and which is insolubilized by the imaging radiation. The coating contains an infrared radiation absorber which operates to increase the localized temperature of the coating to a level at which the rate of the actinic imaging reaction is increased when the plate is subjected to both infrared and either ultraviolet or visible radiation. The solubility of the coating is unaffected by infrared radiation or the heat generated by the infrared radiation. Therefore, the plate is not imageable by infrared radiation.

DESCRIPTION OF THE PREFERRED EMBODIMENT

The invention relates to negative-working lithographic printing plates with coatings which are imageable by ultraviolet or visible radiation, hereinafter referred to as ultraviolet/visible radiation, wherein the radiation causes an insolubilizing reaction in the coating. Typically, the insolubilizing reaction for negative-working plates is a crosslinking or photopolymerization reaction but other chemical changes may also insolubilize the coating and are within the scope of the invention. The insolubilized imaged areas become the ink-receptive plate areas and the non-imaged areas are removed with a typical developer solution. The coatings for such plates are well known in the art and are typically a diazo resin having reactive sites which are capable of being chemically altered by the radiation. An example of a suitable diazo resin is the condensation product of 3-methoxy-4 diazo-diphenylamine and paraformaldehyde. Other suitable diazo compounds are described in a variety of prior patents including U.S. Pat. Nos. 5,998,095; 4,956,261; 3,406,159; 3,277,074; 3,311,605; 3,163,633 and 3,050,502. A second type of negative working lithographic printing plates is those based on the use of photocrosslinkable polymers which are well known in the art. For coatings of this type, the imaging actinic radiation initiates a cross linking reaction at the active sites on the polymer chain, resulting in higher molecular weight species that are insoluble in the developer. Examples of such photopolymers include the p-phenylene diacrylate polyesters. These polyesters are described, for example, in U.S. Pat. Nos. 3,030,208; 3,622,320; 3,702,765 and 3,929,489. A typical example of such a photocrosslinkable polymer is the polyester prepared from diethyl p-phenylenediacrylate and 14-bis(β-hydroxyethoxy)cyclohexane. Other particularly useful polymers of this type are those which incorporate ionic moieties derived from monomers such as dimethyl-3,3'-[(sodioimino)disulfonyl]-dibenzoate and dimethyl-5-sodiosulfoisophthalate. Examples of such polymers include poly[1,4-cyclohexylene-bis(oxyethylene)-p-phenylenediacrylate]-co-3,3'-[(sodioimino)disulfonyl] dibenzoate and poly[1,4-cyclohexylene-bis(oxyethylene)-p-phenylenediacrylate]-co-3,3'-[(sodioimino)disulfonyl] dibenzoate-co-3-hydroxyisophathalate. See U.S. Pat. No. 5,368,974.

Lithographic printing plates may be imaged by digital laser imaging and by digital screen imaging. The imaging radiation of the invention includes the full range of ultraviolet radiation up through visible radiation. For example, blue or violet diode lasers or a double frequency YAG laser at 532 nm can be used. Like most chemical reactions, the rate at which the solubility conversion takes place for the actinic digital imaging of a lithographic plate is dependent on the temperature. The rate of reaction is slower at ambient conditions than at elevated temperatures. By elevating the temperature at which the imaging is done, the speed of the imaging process can be increased. It is problematic to increase the temperature of the entire plate by elevating the temperature of the imaging platen or drum. The thermal expansion of the components of the imager and the dynamics of managing the heat flow to the plate in a timely and uniform manner make this approach impractical.

According to the present invention, the coating is formulated such that the temperature of the coating is increased by exposure to infrared radiation to enhance the actinic imaging reaction. The coating is spot heated with infrared radiation and subjected to the ultraviolet or visible imaging radiation to react the coating while it is at the elevated temperature. The coating is not reacted or otherwise imaged by the infrared radiation or by the heat generated by the infrared radiation. The plate of the invention has a coating composition such that the infrared radiation merely interacts with the coating to heat the coating. Either the ultraviolet/visible radiation or the infrared radiation can be image modulated as discussed below. An infrared absorbing dye is incorporated into the coating to facilitate the infrared absorption and heating. These dyes are well known in the art and include materials such as squarylium, croconate, cyanine, phthalocyanine, merocyanine, chalcogenopyryloarylidene, orzindollizine, puinoid, indolizine, pyrylium, thizine, azulenium and xanthene dyes. The power and intensity of the infrared laser as well as the dye in the coating can be selected to instantaneously increase the coating temperature to enhance the coating reaction by increasing the reaction kinetics. The effect of the coating temperature on the reaction kinetics is progressive, i.e. the higher the temperature, the faster the reaction. Therefore, any temperature increase will have some effect but the preferred coating temperature range is 250 to 400° F. With the higher coating temperature, much less power or time is required to trigger the actinic imaging reaction. Specifically, imaging can be accomplished with much less powerful gas lasers or with a diode or semiconductor laser in the power range of one watt or less. Therefore, the lasers are much less expensive, require less power input, do not require water cooling and are easier to modulate. The ultraviolet radiation is usually in the range of 340 to 390 nm and the visible radiation corresponds to the wavelength of the typically available visible imaging lasers.

With the plate of the invention, either the infrared radiation or the ultraviolet/visible radiation may be image modulated. With modulated ultraviolet/visible radiation, the unmodulated infrared radiation heats an area of the coating which is simultaneously imaged with superimposed modulated ultraviolet/visible radiation. The spot of modulated ultraviolet/visible radiation can be smaller than or the same size as the spot of infrared radiation. Alternately, the modulated spot of ultraviolet/visible radiation can closely trail the unmodulated spot of infrared radiation with the criteria being that the coating is still hot at the time it is subjected to the ultraviolet/visible radiation. With modulated infrared radiation, an area of the coating is exposed to a relatively low level of unmodulated ultraviolet/visible radiation and that spot is simultaneously exposed to the superimposed modulated infrared radiation. The infrared spot is either the same size or smaller than the ultraviolet/visible spot. The level of ultraviolet/visible radiation is low enough that it will not significantly react the coating at ambient temperature during the short exposure time. It is only because of the simultaneous infrared heating that the ultraviolet/visible radiation is sufficient to react the coating in the heated image pattern formed by the infrared radiation.

In order to locally heat the coating and simultaneously image, the spots on the plate from the infrared laser and the digital imager must be located such that the imaging is effected while the coating is hot. This usually requires that the spots be superimposed although the ultraviolet/visible spot may closely trail the infrared spot as noted earlier. Although the spots can be the same size, in order to facilitate superimposition and taking into consideration the ability to aim and focus the lasers, one spot is preferably larger than the other with the small spot being entirely within the bounds of the larger spot. The small spot is the modulated radiation whether that be ultraviolet/visible or infrared. Because the ultraviolet/visible imaging is a progressive process (rather than a threshold process) in which exposure of the coating to moderate levels of the radiation could produce some imaging, the ultraviolet/visible spot is usually the modulated imaging radiation and is the smaller of the two spots with the ultraviolet/visible spot being fully contained within the bounds of the infrared spot. Merely as an example, the large infrared spot may have a diameter of 50 microns while the small digital image spot has a diameter of 10 microns. If the infrared radiation is the modulated radiation, the infrared spot will be the smaller and the level of the ultraviolet/visible radiation is kept quite low so that any coating reaction caused solely by the unmodulated ultraviolet/visible radiation is minimal and insufficient to produce an effective image.

Another example of imaging that can be used with the plate of the present invention is a digital screen imaging system such as marketed by basysPrint Corp. This system uses a radiation source which is usually an ultraviolet light source in conjunction with a mirror surface that is about 2 $cm^2$ and made up of approximately 800,000 individually controllable micromirrors. The ultraviolet light source that hits each mirror is either projected onto the printing plate through an optical lens system or reflected away thus creating an image on the plate. Because of the size of the digital screen, only a segment of the plate is imaged in a single exposure. The exposure head is moved or scanned over the plate to fit the segments together and produce the entire image on the plate. With this type of digital imager, one or more infrared sources are positioned off to the side and aimed at an angle to focus on the area beneath the digital screen.

The imaging of the plate of the present invention may be practiced on any conventional imaging equipment such as flat bed imagers, internal drum imagers and external drum imagers. In order to establish the principal and effectiveness of the present invention and the benefits achieved when imaging a coating at an elevated temperature, conventional plates with ultraviolet imageable coatings were heated to bring the coated plates up to a selected temperature. The heated plates were then imaged with ultraviolet light. The results were compared to unheated plates and to plates which had been heated but cooled prior to imaging.

COMPARATIVE EXAMPLE 1

An Anocoil Waterworks plate, a photopolymer plate commercially available from Anocoil Corporation of Rockville, Conn., was imaged at 250 $mJ/cm^2$ using a Theimer Copymat 64-CP exposure unit having a 2500 watt MuHi spectrum bulb. The exposure negative contained a 21 step Stouffer step wedge. This step wedge is essentially a series of steps with increasing optical density. Each step represents an increase in optical density of 50% more than the preceding step. The plate was processed through an Anocoil Plate Processor filled with Anocoil S Developer. The step wedge reading on the plate after imaging was a 6.

COMPARATIVE EXAMPLE 2

A plate was heated to a temperature of 90° C. The plate was subsequently allowed to cool for five minutes to allow it to return to ambient temperature conditions. The plate was imaged and processed as in Comparative Example 1. The step wedge on the plate was a 6.

EXAMPLE 3

A plate was heated to a temperature of 90° C. and imaged on the Theimer exposure unit while still at elevated temperature. The plate was processed as in Comparative Example 1. The step wedge reading was a 7. This indicates an increase in the imaging speed of approximately 50% over that of Comparative Example 1.

EXAMPLE 4

A plate was made in the manner of Example 3 except that the temperature to which the plate was heated was 180° C. In this case the step wedge reading was 7.5. This indicates an increase in imaging speed of approximately 75% relative to that of Comparative Example 1.

The preceding examples demonstrate the advantages of a plate according to the invention which is adapted to be locally heated by infrared radiation as it is being actinically imaged. Comparative Example 2 demonstrates that the present invention differs from other prior art where a preheat is used to effect a change in one component of the coating which then renders it imageable. Comparative Example 2 shows that after cooling the plate has exactly the same imaging characteristics as the unheated plate and there was no conversion of any coating component as a result of the heating. The plate of the present invention makes possible the concurrent infrared heating and imaging exposure processes to effect the selective imaging. This plate establishes the dynamic relationship between the heating and imaging.

What is claimed is:

1. A negative-working lithographic printing plate comprising a soluble coating on a lithographic printing plate substrate wherein the coating comprises a composition:
   a. which is reactive to imaging radiation selected from ultraviolet and visible radiation to insolubilize and image said coating in areas exposed to said imaging radiation;
   b. which contains an infrared radiation absorbing dye whereby said coating may be heated by non-imaging infrared radiation to increase the rate of imaging of said coating by said imaging radiation; and
   c. which is non-reactive to infrared radiation and heat whereby said coating cannot be insolubilized and imaged by said infrared radiation or the heat produced by said infrared radiation.

2. A lithographic printing plate as recited in claim 1 wherein said coating composition is a diazo resin.

3. A lithographic printing plate as recited in claim 1 wherein said coating composition is a photopolymer.

4. A negative-working lithographic printing plate comprising a lithographic printing plate substrate having a soluble coating thereon comprising a composition:
   a. which is reactive to imaging radiation selected from ultraviolet and visible radiation to thereby insolubilize selected areas of said coating;
   b. which contains an infrared radiation absorbing dye whereby said coating may be heated by non-imaging infrared radiation thereby increasing the rate of the insolubilizing reaction in said selected areas of said coating by said imaging radiation; and
   c. which is non-reactive to infrared radiation and heat whereby said coating cannot be insolubilized by said infrared radiation or the heat produced by said infrared radiation.

5. A negative-working lithographic printing plate comprising a soluble coating on a substrate wherein the coating has a composition which will react to imaging radiation in the ultraviolet or visible range to insolubilize the imaged area of the coating and wherein the coating composition contains an infrared absorbing dye so that the coating may be heated by infrared radiation to increase the rate of the insolubilizing reaction and wherein the coating is not imaged and insolubilized by the infrared radiation or the heat produced by said infrared radiation.

* * * * *